United States Patent
Rofougaran et al.

(10) Patent No.: US 7,683,851 B2
(45) Date of Patent: Mar. 23, 2010

(54) METHOD AND SYSTEM FOR USING A SINGLE TRANSFORMER FOR FM TRANSMIT AND FM RECEIVE FUNCTIONS

(75) Inventors: Ahmadreza Rofougaran, Newport Coast, CA (US); Maryam Rofougaran, Rancho Palos Verde, CA (US)

(73) Assignee: Broadcom Corporation

( * ) Notice: Subject to any disclaimer, the term of this patent is extended or adjusted under 35 U.S.C. 154(b) by 184 days.

(21) Appl. No.: 11/750,103

(22) Filed: May 17, 2007

(65) Prior Publication Data
US 2008/0231536 A1  Sep. 25, 2008

Related U.S. Application Data
(60) Provisional application No. 60/895,698, filed on Mar. 19, 2007.

(51) Int. Cl.
*H01Q 1/50* (2006.01)
(52) U.S. Cl. ........................................ 343/850
(58) Field of Classification Search ................ 343/850; 455/121, 333, 341, 562.1, 142, 200.1, 234.1, 455/236.1
See application file for complete search history.

(56) References Cited

U.S. PATENT DOCUMENTS

| | | | | |
|---|---|---|---|---|
| 2,704,815 A | * | 3/1955 | Guiles | 307/149 |
| 4,010,327 A | * | 3/1977 | Kobrinetz | 455/561 |
| 4,647,327 A | * | 3/1987 | Rase | 156/87 |
| 6,505,072 B1 | * | 1/2003 | Linder et al. | 607/32 |
| 2006/0270377 A1 | * | 11/2006 | Bhatti et al. | 455/333 |

FOREIGN PATENT DOCUMENTS

JP  4-280137  * 10/1992

\* cited by examiner

*Primary Examiner*—Hoang V Nguyen
(74) *Attorney, Agent, or Firm*—McAndrews, Held & Malloy, Ltd.

(57) ABSTRACT

Aspects of a method and system for using a single transformer for FM transmit and FM receive functions may include communicating radio frequency signals via an antenna coupled to primary windings of a radio frequency transformer, wherein first secondary windings of the radio frequency transformer may be utilized for receiving the communicated radio frequency signals, and second secondary windings of the radio frequency transformer may be utilized for transmitting the communicated radio frequency signals. Receiving and transmitting may be performed in time division duplex mode or simultaneously. A number of windings of the second secondary windings that may be used for transmitting of the radio frequency signals, may be less than or equal to a number of windings of the primary windings.

8 Claims, 4 Drawing Sheets

METHOD AND SYSTEM FOR USING A SINGLE TRANSFORMER FOR FM TRANSMIT AND FM RECEIVE FUNCTIONS

CROSS-REFERENCE TO RELATED APPLICATIONS/INCORPORATION BY REFERENCE

This application makes reference to, claims priority to, and claims the benefit of U.S. Provisional Application Ser. No. 60/895,698, filed on Mar. 19, 2007.

This application also makes reference to:

U.S. application Ser. No. 11/750,111, filed on May 17, 2007; and

U.S. application Ser. No. 11/750,091, filed on May 17, 2007.

Each of the above referenced applications is hereby incorporated herein by reference in its entirety.

FIELD OF THE INVENTION

Certain embodiments of the invention relate to signal processing for communication systems. More specifically, certain embodiments of the invention relate to a method and system for using a single transformer for FM transmit and FM receive functions.

BACKGROUND OF THE INVENTION

Many communication systems require appropriate coupling of the antenna to the receiver and transmitter hardware. One reason, may be a need to match impedances between the transmitter and/or the receiver and the antenna. Impedance matching may attempt to equalize the output impedance at the antenna to the input impedance of the system that may be connected to the antenna. By matching the impedance, the power transfer from and to the antenna may be maximized and reflections due to impedance mismatch may be reduced. In some instances, matching impedances may be undesirable though. For example, an antenna coupled to a high impedance load may provide better voltage transfer while the high impedance may lower the loading of the antenna. In some cases, this may be referred to as impedance bridging. In most cases, however, suitable impedance matching may be desirable and may require some type of a matching network between antenna and the receiver and/or transmitter.

In many modern radio frequency communication systems, mobile communication terminals are increasingly miniaturized and it may become increasingly important to provide matching circuitry with a reduced number of limited-size components. For implementations of matching circuits on circuit boards, it may be particularly desirable to reduce the number of required system components.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for using a single transformer for FM transmit and FM receive functions, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for using a single transformer for FM transmit and FM receive functions. Aspects of the method and system for using a single transformer for FM transmit and FM receive functions may comprise communicating radio frequency signals via an antenna coupled to primary windings of a radio frequency transformer, wherein first secondary windings of the radio frequency transformer may be utilized for receiving the communicated radio frequency signals, and second secondary windings of the radio frequency transformer may be utilized for transmitting the communicated radio frequency signals. Receiving and transmitting may be performed in time division duplex mode or simultaneously.

A number of windings of the second secondary windings that may be used for transmitting of the radio frequency signals, may be less than or equal to a number of windings of the primary windings. A number of windings of the first secondary windings that may be used for receiving of the radio frequency signals, may be less than or equal to a number of windings of the primary windings. The antenna may be a single-ended antenna, coupled to a first terminal of the primary windings, and a second terminal of the primary windings may be coupled to ground. In another embodiment of the invention, the antenna may be a differential antenna and a first antenna terminal may be coupled to a first terminal of the primary windings and a second antenna terminal may be coupled to a second terminal of the primary windings. The communicated radio frequency signals may be frequency modulated, Bluetooth signals and/or Wireless LAN signals.

Figure 1:
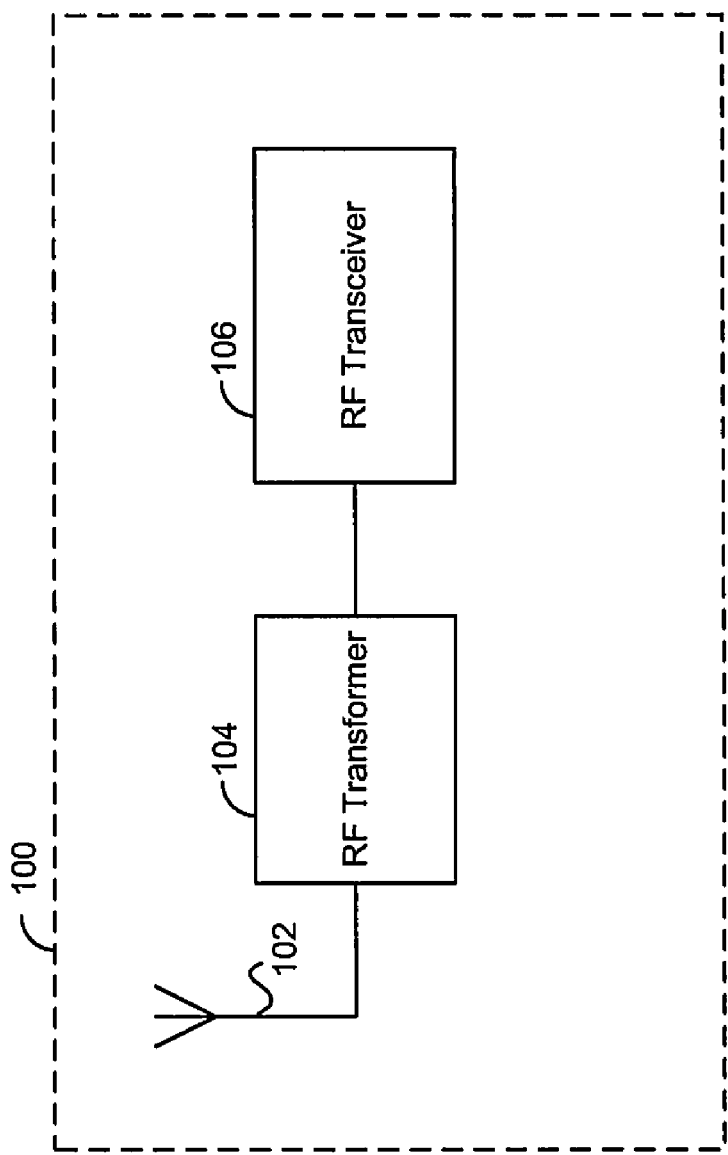
FIG. 1 is a block diagram illustrating an exemplary RF receiver system, in accordance with an embodiment of the invention.

FIG. 1 is a block diagram illustrating an exemplary RF receiver system, in accordance with an embodiment of the invention. Referring to FIG. 1, there is shown an RF receiver system 100 comprising an antenna 102, an RF transformer 104 and an RF transceiver 106.

A radio frequency (RF) transformer may comprise suitable logic, circuitry and/or code to enable suitable coupling of the antenna 102 to the RF transceiver 106. The RF transformer 104 may, for example, match the impedance of the antenna to the RF transceiver 106. The RF transceiver 106 may comprise suitable logic, circuitry and/or code to enable processing and generating of RF receive signals and/or RF transmit signals, respectively.

Figure 2A:
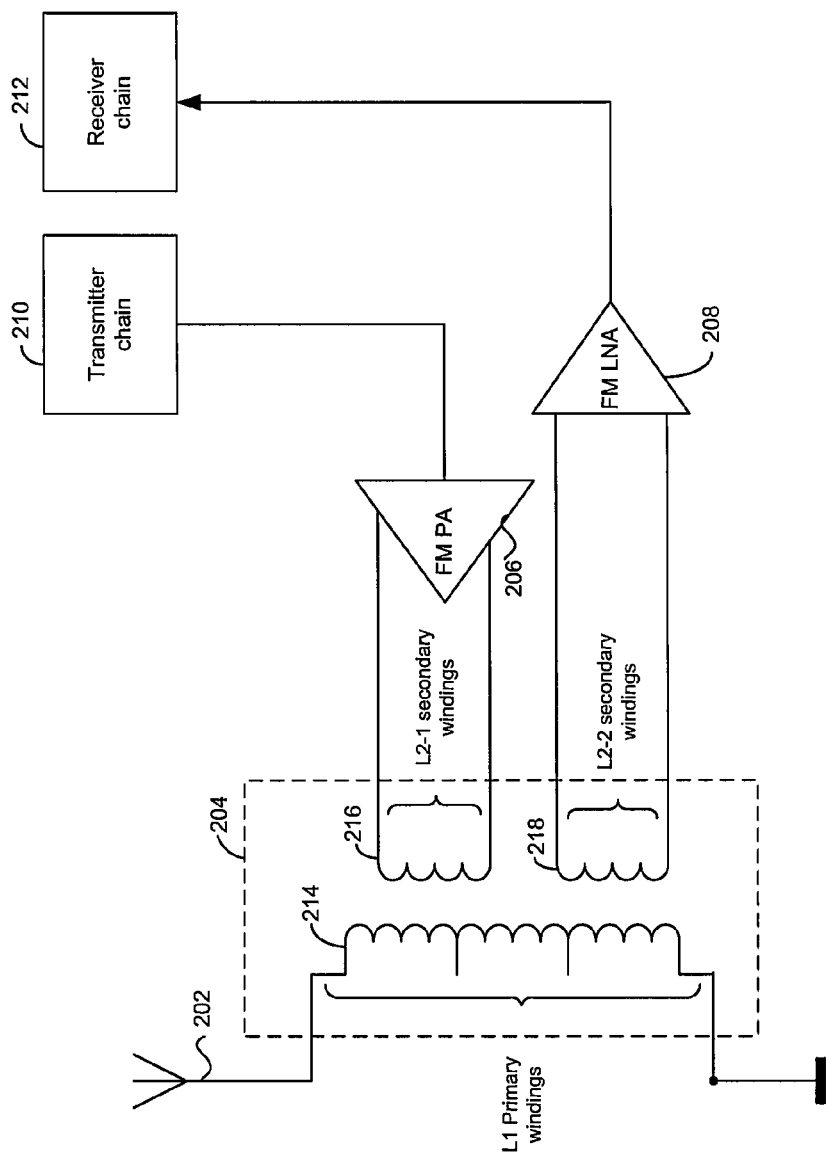
FIG. 2A is a circuit diagram illustrating an exemplary duplex transformer, in accordance with an embodiment of the invention.

FIG. 2A is a circuit diagram illustrating an exemplary duplex transformer, in accordance with an embodiment of the invention. Referring to FIG. 2A, there is shown an antenna 202, an RF transformer 204, a power amplifier 206, a low-noise amplifier 208, a transmitter chain 210 and a receiver chain 212. The RF transformer 204 may comprise a primary winding 214 and secondary windings 216 and 218.

In accordance with various embodiments of the invention, an RF transformer 204 may be used as a transmit transformer and/or a receive transformer, coupling antenna 202 to the power amplifier 206 to enable transmission, and to the low-noise amplifier 208 to enable reception, respectively. When a signal is received at antenna 202, it may be fed to the primary winding 214 of the RF transformer 204. The primary winding 214 may comprise L1 windings. The primary winding 214 may transfer electrical energy received via the antenna 202 to the secondary winding 218 by magnetic coupling. The low-noise amplifier 208 may be coupled to the secondary winding 218 and may comprise suitable logic, circuitry and/or code to enable amplification of a signal received at the secondary winding 218. The secondary winding 218 may comprise, for example, L2-2 windings. Typically, since the received signal at the antenna 202 may be a low-energy signal, the secondary winding 218 may comprise L2-2>L1 windings. A larger number of windings for the secondary winding 218 may increase the impedance and may lead to a higher voltage gain. In other words, the antenna 202 may be less strongly loaded and the signal received by the low-noise amplifier 208 may be stronger than it would be if the number of windings L2-2 were equal to, or smaller, than L1. The amplified signal at the output of the low-noise amplifier 208 may be fed to the receiver chain 212, which may comprise suitable logic, circuitry and/or code to enable processing of the received radio frequency signal.

For transmission, the transmitter chain 210 may comprise suitable logic, circuitry and/or code to enable generation of RF transmit signals. The generated RF transmit signals from the transmitter chain 210 may be coupled to the input of the power amplifier 206. For an RF transmit signal, it may be desirable to transmit at higher power levels than the power levels of a receive signal. Hence, the RF transmit signal may be amplified in the power amplifier 206, which may comprise suitable logic, circuitry and/or code to enable power amplification of the signal at its input. The output of the power amplifier 206 may be coupled to the secondary winding 216.

For transmission purposes, the number of effective windings L2-1 of the secondary winding 216 may generally be desired lower than L2-2 because a lower impedance for transmission may be desirable. In one embodiment of the invention, an impedance of approximately 50 Ohm or less for transmission may be desirable. The secondary winding 216 may transfer electrical energy received via power amplifier 206 to the primary winding 214 by magnetic coupling, from where the signal may be fed to the antenna 202.

In some instances, reception and transmission may occur in a time division duplex (TDD) mode. In this case, only transmission or reception may occur at any given instance in time. In another embodiment of the invention, transmission and reception may take place simultaneously. It may generally be desirable that the transmit frequency be different from the receive frequency in case of simultaneous operation, to reduce interference problems, for example.

Figure 2B:
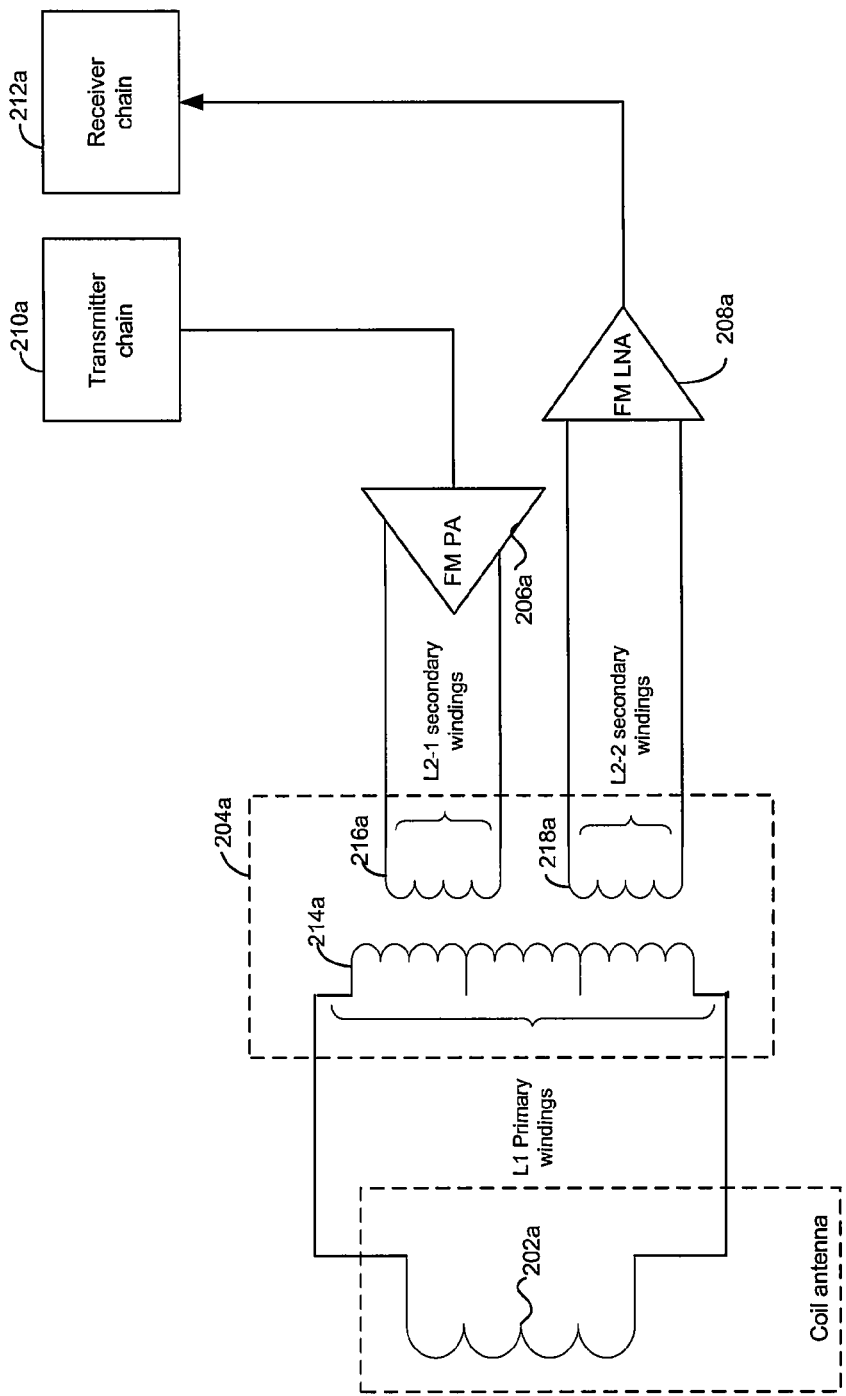
FIG. 2B is a circuit diagram illustrating an exemplary duplex transformer with a differential antenna, in accordance with an embodiment of the invention.

FIG. 2B is a circuit diagram illustrating an exemplary duplex transformer with a differential antenna, in accordance with an embodiment of the invention. Referring to FIG. 2B, there is shown a differential antenna 202a, an RF transformer 204a, a power amplifier 206a, a low-noise amplifier 208a, a transmitter chain 210a and a receiver chain 212a. The RF transformer 204a may comprise a primary winding 214a and secondary windings 216a and 218a. The RF transformer 204a, the power amplifier 206a, the low-noise amplifier 208a, the transmitter chain 210a and the receiver chain 212a may be substantially similar to the RF transformer 204, the power amplifier 206, the low-noise amplifier 208, the transmitter chain 210 and the receiver chain 212, respectively, as illustrated and described in FIG. 2A.

In one embodiment of the invention, a differential antenna 202a with two output terminals may be coupled to the RF transformer 204a. A differential antenna 204a may be, for example, a coil antenna as illustrated in FIG. 2B or a loop antenna. Whereas the transformer in FIG. 2A may also perform a conversion function from an unbalanced signal to a balanced signal and vice versa (balun functionality), a differential antenna with dual antenna ports may already provide a balanced differential receive signal to the RF transformer 204a.

Figure 3:
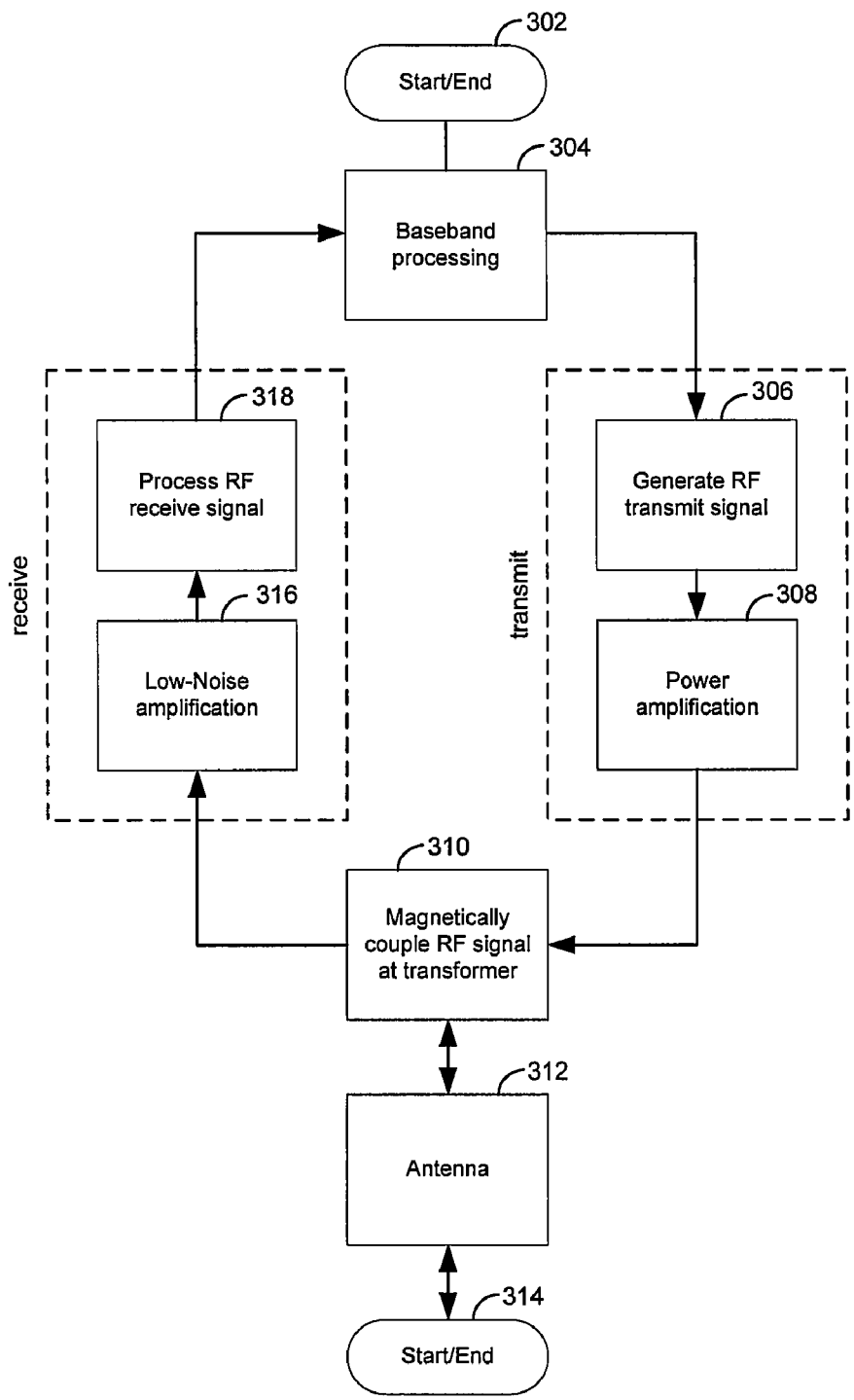
FIG. 3 is a flow chart illustrating simultaneous receiver and transmitter operation, in accordance with an embodiment of the invention.

FIG. 3 is a flow chart illustrating simultaneous receiver and transmitter operation, in accordance with an embodiment of the invention. In one embodiment of the invention, RF signal reception may be simultaneous with RF signal transmission. In another embodiment of the invention, RF signal reception and RF signal transmission may be separated in time, as described above. In the case of RF signal transmission, a baseband signal may be generated in step 304. From the baseband signal generated in step 304, an RF transmit signal may be generated in step 306. The RF transmit signal may be amplified in step 308 before it may be magnetically coupled in step 310. Generally, magnetic coupling of the RF signal in step 310 may occur at a RF transformer. In step 312, the RF transmit signal may be transmitted from an antenna.

In the case of reception, the RF receive signal may be received by an antenna in step 312. The RF receive signal may be magnetically coupled to a receive signal chain in a transformer in step 310. The RF receive signal may be amplified by, for example, a low-noise amplifier in step 316. In step 318, the RF signal may be processed. For example, in step 318, the signal may be demodulated and converted to baseband. In step 304, the baseband receive signal may be appropriately processed further.

In accordance with an embodiment of the invention, a method and system for using a single transformer for FM transmit and FM receive functions may comprise communicating radio frequency signals via an antenna 202 coupled to primary windings 214 of a radio frequency transformer 204, wherein first secondary windings 218 of the radio frequency transformer 204 may be utilized for receiving the communicated radio frequency signals, and second secondary windings 216 of the radio frequency transformer 204 may be utilized for transmitting the communicated radio frequency signals. Receiving and transmitting may be performed in time division duplex mode or simultaneously. A number of windings L2-1 of the second secondary windings 216 that may be used for transmitting of the radio frequency signals, may be less than or equal to a number of winding L1 of the primary windings. A number of windings L2-2 of the first secondary windings 218 that may be used for receiving of the radio frequency signals, may be less than or equal to a number of winding L1 of the primary windings. The antenna 202 may be a single-ended antenna, coupled to a first terminal of the primary windings, and a second terminal of the primary windings may be coupled to ground, as illustrated in FIG. 2A. In another embodiment of the invention, the antenna 202a may be a differential antenna and a first antenna terminal may be coupled to a first terminal of the primary windings and a second antenna terminal may be coupled to a second terminal of the primary windings, as illustrated in FIG. 2B. The communicated radio frequency signals may be frequency modulated, Bluetooth signals and/or Wireless LAN signals.

Another embodiment of the invention may provide a machine-readable storage, having stored thereon, a computer program having at least one code section executable by a machine, thereby causing the machine to perform the steps as described above for using a single transformer for FM transmit and FM receive functions.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing communication signals, the method comprising:
    communicating radio frequency signals via an antenna coupled to primary windings of a radio frequency transformer, wherein first secondary windings of said radio frequency transformer are utilized for receiving said communicated radio frequency signals, and second secondary windings of said radio frequency transformer are utilized for transmitting said communicated radio frequency signals; and
    operating said receiving and said transmitting simultaneously.

2. A method for processing communication signals, the method comprising:
    communicating radio frequency signals via an antenna coupled to primary windings of a radio frequency transformer, wherein first secondary windings of said radio frequency transformer are utilized for receiving said communicated radio frequency signals, and second secondary windings of said radio frequency transformer are utilized for transmitting said communicated radio frequency signals, wherein said antenna is a single-ended antenna coupled to a first terminal of said primary windings, and a second terminal of said primary windings is coupled to ground.

3. A method for processing communication signals, the method comprising:
    communicating radio frequency signals via an antenna coupled to primary windings of a radio frequency transformer, wherein first secondary windings of said radio frequency transformer are utilized for receiving said communicated radio frequency signals, and second secondary windings of said radio frequency transformer are utilized for transmitting said communicated radio frequency signals, and wherein said communicated radio frequency signals are Bluetooth signals.

4. A method for processing communication signals, the method comprising:
    communicating radio frequency signals via an antenna coupled to primary windings of a radio frequency transformer, wherein first secondary windings of said radio frequency transformer are utilized for receiving said communicated radio frequency signals, and second secondary windings of said radio frequency transformer are utilized for transmitting said communicated radio frequency signals, and wherein said communicated radio frequency signals are Wireless LAN signals.

5. A system for processing communication signals, the system comprising:
    one or more circuits, said one or more circuits enable:
    communication of radio frequency signals via an antenna coupled to primary windings of a radio frequency transformer, wherein first secondary windings of said radio frequency transformer are utilized for receiving said communicated radio frequency signals, and second secondary windings of said radio frequency transformer are utilized for transmitting said communicated radio frequency signals, and wherein said one or more circuits operate said receiving and said transmitting simultaneously.

6. A system for processing communication signals, the system comprising:
    one or more circuits, said one or more circuits enable:
    communication of radio frequency signals via an antenna coupled to primary windings of a radio frequency transformer, wherein first secondary windings of said radio frequency transformer are utilized for receiving said communicated radio frequency signals, and second secondary windings of said radio frequency transformer are utilized for transmitting said communicated radio frequency signals, and wherein said antenna is a single-ended antenna, coupled to a first terminal of said primary windings, and a second terminal of said primary windings is coupled to ground.

7. A system for processing communication signals, the system comprising:
    one or more circuits, said one or more circuits enable:
    communication of radio frequency signals via an antenna coupled to primary windings of a radio frequency transformer, wherein first secondary windings of said radio frequency transformer are utilized for receiving said communicated radio frequency signals, and second secondary windings of said radio frequency transformer are utilized for transmitting said communicated radio frequency signals, and wherein said communicated radio frequency signals are Bluetooth signals.

8. A system for processing communication signals, the system comprising:
    one or more circuits, said one or more circuits enable:
    communication of radio frequency signals via an antenna coupled to primary windings of a radio frequency transformer, wherein first secondary windings of said radio frequency transformer are utilized for receiving said communicated radio frequency signals, and second secondary windings of said radio frequency transformer are utilized for transmitting said communicated radio frequency signals, and wherein said communicated radio frequency signals are Wireless LAN signals.

* * * * *